US009502242B2

(12) United States Patent
Won et al.

(10) Patent No.: US 9,502,242 B2
(45) Date of Patent: Nov. 22, 2016

(54) INDIUM GALLIUM ZINC OXIDE LAYERS FOR THIN FILM TRANSISTORS

(71) Applicant: Applied Materials, Inc., Santa Clara, CA (US)

(72) Inventors: Tae Kyung Won, San Jose, CA (US); John M. White, Hayward, CA (US); Soo Young Choi, Fremont, CA (US); Jung-Chi (Eric) Lu, Tainan (TW)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/599,696

(22) Filed: Jan. 19, 2015

(65) Prior Publication Data

US 2015/0221507 A1    Aug. 6, 2015

Related U.S. Application Data

(60) Provisional application No. 61/936,276, filed on Feb. 5, 2014.

(51) Int. Cl.
*H01L 21/02* (2006.01)
*C23C 16/40* (2006.01)
*C23C 16/455* (2006.01)
*C23C 16/509* (2006.01)

(52) U.S. Cl.
CPC ....... *H01L 21/02565* (2013.01); *C23C 16/407* (2013.01); *C23C 16/45574* (2013.01); *C23C 16/5096* (2013.01); *H01L 21/0262* (2013.01); *H01L 21/02472* (2013.01); *H01L 21/02483* (2013.01); *H01L 21/02554* (2013.01)

(58) Field of Classification Search
CPC .................. H01L 21/02472; H01L 21/02483; H01L 21/02554; H01L 21/02565; H01L 21/0262
See application file for complete search history.

(56) References Cited

U.S. PATENT DOCUMENTS

| | | | |
|---|---|---|---|
| 2009/0035877 A1* | 2/2009 | Im | C23C 16/409 438/3 |
| 2009/0120464 A1* | 5/2009 | Rasheed | C23C 16/4412 134/21 |
| 2010/0181565 A1* | 7/2010 | Sakata | C23C 14/086 257/43 |
| 2013/0193432 A1* | 8/2013 | Yamazaki | H01L 29/7869 257/43 |
| 2013/0264632 A1 | 10/2013 | Ding et al. | |
| 2013/0280859 A1* | 10/2013 | Kim | H01L 29/7869 438/104 |
| 2014/0204305 A1 | 7/2014 | Tseng | |
| 2014/0273342 A1 | 9/2014 | Yim et al. | |
| 2015/0011047 A1 | 1/2015 | Huang et al. | |

\* cited by examiner

*Primary Examiner* — Whitney T Moore
*Assistant Examiner* — Joseph Galvin, III
(74) *Attorney, Agent, or Firm* — Patterson & Sheridan, LLP

(57) ABSTRACT

Embodiments of the present disclosure generally provide a method and apparatus for forming an IGZO active layer within a thin film transistor (TFT) device. In one embodiment, a method is provided for forming an IGZO active layer on a dielectric surface using a PECVD deposition process. In one embodiment, a method is provided for pretreating and passivating the dielectric surface for receiving the PECVD formed IGZO layer. In another embodiment, a method is provided for treating a PECVD formed IGZO layer after depositing said layer. In another embodiment, a method is provided for forming a multi-layer or complex layering structure of IGZO, within a PECVD processing chamber, for optimizing TFT electrical characteristics such as carrier density, contact resistance, and gate dielectric interfacial properties. In yet another embodiment, a method is provided for forming integrated layers for a TFT including IGZO within an in-situ environment of a cluster tool.

19 Claims, 6 Drawing Sheets

INDIUM GALLIUM ZINC OXIDE LAYERS FOR THIN FILM TRANSISTORS

CROSS-REFERENCE TO RELATED APPLICATIONS

This application claims benefit of U.S. Provisional Patent Application Ser. No. 61/936,276 (APPM/21586L), filed Feb. 5, 2014, which is incorporated herein by reference.

BACKGROUND OF THE DISCLOSURE

1. Field

Embodiments of the disclosure generally relate to a method and apparatus for forming a thin film transistor device.

2. Description of the Background Art

Several trends in the evolution of flat screen displays are larger screen sizes, smaller pixels, LED-based pixels, and reduced display power consumption. These trends have resulted in challenging design requirements for the formation of thin film transistors (TFTs) that can meet these needs. Because Indium Gallium Zinc Oxide (IGZO) can be made with a carrier mobility 20-50 times greater than that of amorphous silicon, TFTs with IGZO channels can be made smaller, more transparent and less power-consuming than TFTs with amorphous silicon channels.

TFTs can be formed by depositing and lithographically patterning a series of layers disposed over a substrate such as glass. These layers include conducting layers, dielectric layers and a semiconducting layer. Semiconducting materials such as amorphous silicon or metal-oxide semiconductors (e.g., IGZO) can be used to form a semiconducting channel region between a source and a drain of a TFT device. Semiconducting materials can be deposited using methods such as physical vapor deposition (PVD, or sputtering), atomic layer deposition (ALD), and chemical vapor deposition (CVD).

Each of the described methods of depositing an IGZO layer has its own set of challenges and problems. First of all, PVD IGZO films are limited to the stoichiometries of the PVD targets, which are manufactured and used to form TFTs with considerable investments of money and time for a researcher studying a new stoichiometric combination of IGZO film. Targets are commercially available that are 1:1:1:4 (indium:gallium:zinc:oxygen ratios), which may be referred to as 1:1:1 where it is presumed that the metal components are completely oxidized. Similarly, some other stoichiometries are readily available. Any requested indium-gallium-zinc target stoichiometry can be custom-manufactured by hot-pressing together the mixed powder oxides $In_2O_3$, $Ga_2O_3$, and ZnO in the correct proportions with a cycle time on the order of weeks or months. This not only limits the speed of PVD IGZO process development, but limits complexity of a practically deposited structure. A PVD stoichiometric bi-layer process can require two separate PVD chambers, which is more expensive in production than a single-chamber process. In this disclosure, the words "layer" and "film" are used interchangeably, and the term "sublayer" is meant to denote a part of a layer.

Second, while ALD deposited IGZO can meet TFT carrier density requirements, an ALD IGZO process is a very slow, or low-throughput, process. The low throughput problem found with ALD processes is partially solved by using ALD for a first complete layer, or nucleation layer, followed by a CVD depositing of IGZO to complete the semiconducting layer which can exhibit high carrier density. In general, one skilled in the art can appreciate that the properties of a nucleation film can define substantially those properties of a subsequently deposited bulk film. In the case of an ALD-plus-CVD IGZO processing, faster CVD depositing can produce, within a shorter time, a bulk film whose characteristics are close to those of an ALD-only IGZO process. However, an ALD-plus-CVD IGZO process is a relatively low-throughput process sequence (compared to a CVD-only IGZO process), which can require the use of two separate processing chambers.

Third, CVD-only IGZO processes to date have resulted in films whose carrier densities are below TFT design requirements for IGZO layers.

Another problem with IGZO layers is their susceptibility to environmental degradation, reported as the diffusion of hydrogen atoms into the IGZO active layer, which affects the transistor's properties. Moving substrates between processing systems exposes the unprotected IGZO top layer to atmospheric humidity, which can be absorbed into and on the surface of the exposed film. Native oxides can also form on materials exposed to air.

Therefore, there is a need for a method and apparatus for forming a thin film transistor device that includes an indium gallium zinc oxide (IGZO) layer that solves the problems described above.

SUMMARY

The present disclosure generally relates to TFTs formed in display devices, and to thin film processes and related apparatus for depositing layers onto substrates using chemical vapor deposition processes. More specifically, the present disclosure describes processes and related apparatus for depositing IGZO active layers and integrated underlayers and overlayers on a substrate.

The disclosure describes embodiments of methods for forming transistors with IGZO channels. These methods may also include substrate preheating, in-situ substrate cleaning and in-situ layer treating steps that are used to improve the properties of deposited films. Embodiments of the methods include the deposition of high-mobility IGZO active layers entirely by use of a chemical vapor deposition process, without the need for a prior-deposited nucleation layer.

This disclosure includes methods for forming transistors containing an IGZO layer formed from IGZO sublayers. By varying the process parameters for the sublayer deposition steps, complex IGZO layered structures may be formed, whose applications can include reduced contact resistances and layers having a desirable bandgap.

This disclosure additionally describes cleaning processes for in-situ cleaning deposits from surfaces of an IGZO plasma enhanced chemical vapor deposition (PECVD) processing chamber. Even though PECVD processing chambers are generally designed to prevent deposition onto non-substrate surfaces, eventually the non-substrate surfaces require cleaning. Deposited byproducts from an IGZO PECVD process can be cleaned using a plasma that contains a halogenated gas mixture.

Embodiments of the disclosure may provide methods for forming portions of a TFT device using a cluster tool-integrated (in-situ) process to form a three-layer gate dielectric-IGZO-top dielectric stack and other such multilayer structures on a substrate. Depositing a multiple layer stack in-situ in a cluster tool avoids exposing formed layers to air and humidity, while improving throughput and production in a high-volume factory environment.

Embodiments of the disclosure described herein may provide a method of forming a transistor device comprising three method steps henceforth described. First, delivering, through a first port in a gas distribution apparatus, a first gas mixture of metal-organic precursor gases that comprises indium, gallium, zinc, and a first carrier gas to a surface of a substrate disposed in a processing region of a processing chamber. Second, delivering, through a second port in the gas distribution apparatus, a second precursor gas mixture that comprises an oxygen-containing gas to a surface of a substrate disposed in a processing region of a processing chamber. Third, forming an IGZO layer on an insulating layer by forming a plasma that comprises the first metal-organic precursor gas mixture and the second oxygen-containing precursor gas mixture.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

The present disclosure generally provides methods for forming an IGZO active layer within a thin film transistor (TFT) device. However, it should be understood that the embodiments disclosed herein may have utility in system configurations other than those shown in the illustrative examples of the disclosure, and that these embodiments may also find applications which are not related to displays or display TFTs, for example, integrated circuits, micro-electro-mechanical systems (MEMS) and solar panels. Embodiments of the disclosure may also find utility in processes not directly detailed in this disclosure, such as plasma etching and layer treating processes.

Figure 1:
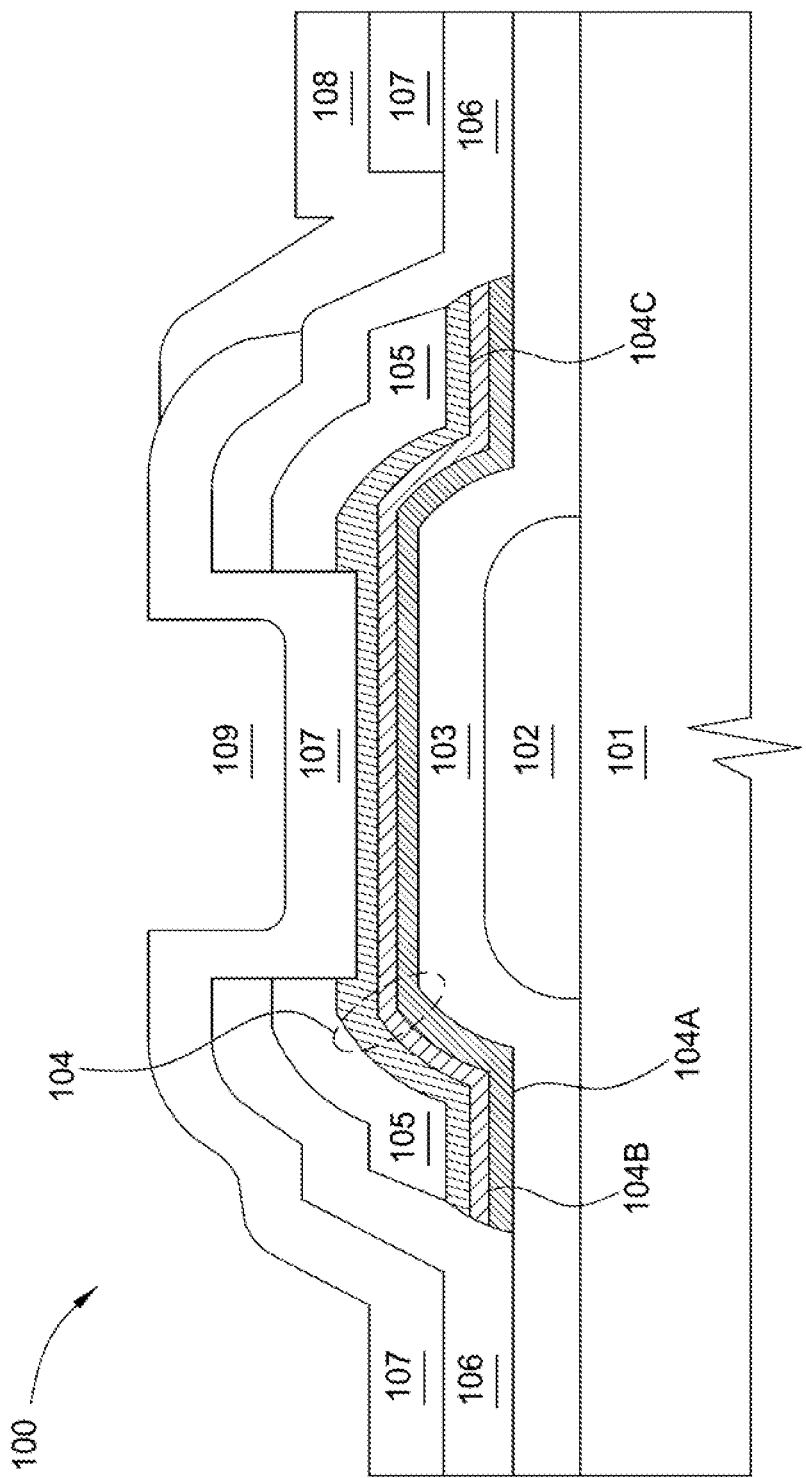
FIG. 1 is a schematic cross-sectional diagram of a TFT device having an IGZO active layer, according to an embodiment of the disclosure.

FIG. 1 is a cross-sectional diagram for a bottom-gate TFT device 100 that is formed on a substrate 101. A substrate 101 for liquid crystal display (LCD) or organic light emitting diode (OLED) applications is typically transparent and rectangular. One popularly used material is glass. Glass display substrate sheets span different industry-defined sizes, ranging presently from less than one square meter (down to wafer sizes for research and development) to about 9 square meters for Gen10 display substrates.

The TFT device 100 includes a gate electrode layer 102 which is formed on the substrate 101. The gate electrode layer 102 material is typically a conductive metal layer, such as a chromium or a tantalum containing layer. The gate electrode layer 102 can be formed using conventional deposition, lithographic patterning and etching techniques.

A gate dielectric layer 103 is formed over the patterned gate electrode layer 102. Typical materials for a gate dielectric layer 103 are silicon dioxide, silicon nitride, and silicon oxynitride. Alternate materials for gate dielectric layer 103 include aluminum oxide and other insulating oxides of metals. Gate dielectric layer 103 thicknesses can typically range from about 100 angstroms (Å) to about 6000 Å. This gate dielectric layer 103 can be formed using a high density plasma (HDP) type of plasma enhanced chemical vapor deposition (PECVD) processing chamber, such as those manufactured and sold by Applied Materials Inc. for manufacturing TFTs on rectangular display substrates.

A bulk semiconductor layer 104 is formed on the gate dielectric layer 103. In one embodiment, the bulk semiconductor layer 104 can comprise an IGZO active layer, which could be deposited using an embodiment of a CVD system described herein. The bulk semiconductor layer 104 may be deposited to a thickness in the range of about 100 Å to about 3000 Å. The bulk semiconductor layer 104 may in some cases include three separate sublayers 104A, 104B, and 104C as illustrated in FIG. 1. In one example, the stoichiometric properties of sublayer 104A are tailored for optimizing gate dielectric interface characteristics. In a simpler embodiment, the bulk semiconductor layer 104 has only one sublayer. In some embodiments, the bulk semiconductor layer 104 is composed of N sublayers that are used to optimize a TFT device's electrical performance. In yet another embodiment, bulk semiconductor layer 104 is composed of a large number of sublayers, such that the resulting layer contains an observable gradient in material composition and/or properties. The bulk semiconductor layer 104 can be produced in a PECVD processing chamber by controlling gas flows and other process parameters as a function of time. An example of the processing chamber is described below, and may be available from Applied Materials' AKT division.

Layer 105 is an optional conductive contacting layer formed on top of the bulk semiconductor layer 104. In some configurations the contacting layer 105 is not present in the TFT device 100, wherein conducting metal lines directly couple to sources and drains. Contacting layer 105 can be used for reducing contact resistances at the sources and drains of the TFT devices, for preventing diffusion of atoms into or out of the bulk semiconductor layer 104, for protecting (or passivating) the active area from moisture absorption or processing damage, and for stopping the etching of a subsequently deposited layer.

The contacting layer 105 can be formed from materials such as an n-type (n+) or p-type (p+) doped IGZO layer, an IGZO layer with a different composition than the bulk semiconductor layer 104, a doped conducting silicon material, a conducting metal, or a conducting metal oxide such as indium tin oxide (ITO). Contacting layer 105 may be deposited to a thickness within a range of about 100 Å to about 3000 Å.

In one embodiment, the contacting layer 105 can formed from highly conductive (sometimes referred to as highly doped) IGZO that is formed on the bulk semiconducting IGZO layer 104. As illustrated in FIG. 1, the contacting layer 105 is removed from the portion of the TFT device 100 immediately over the feature 109. Thus the material properties of an IGZO contacting layer 105 can be formed which optimizes source/drain contact resistances, and which is not constrained by the material requirements for the TFT active layer. Furthermore, the contacting layer 105 can include sublayers for separately minimizing contacting layer 105 top and bottom interface resistances. In yet another embodiment, contacting layer 105 is a metal layer, comprising indium, gallium, or zinc or a combination thereof, formed in the IGZO processing chamber by a PECVD process. In a different embodiment, a metallic contacting layer 105 can be formed using PVD within a processing chamber integrated onto a cluster tool along with an IGZO processing chamber used for forming the bulk semiconductor layer 104.

Layers 106 and 108 are conductive layers which connect the TFT device 100 to other supporting devices. Conducting layers 106 and 108 can be formed from metals such as chromium (Cr), aluminum (Al), or tantalum (Ta), or alloys thereof, or metal layer stacks thereof. The conducting layers 106 and 108 can also be formed from conductive metal oxides, such as indium-tin oxide (ITO), which are essentially transparent. Conducting layers 106 and 108 are typically 500 Å to 10,000 Å thick. Generally conducting layer 106 is formed after conductive contacting layer 105, dielectric layer 107 is formed after conducting layer 106, and finally conducting layer 108 is formed after dielectric layer 107. Dielectric layer 107 is a dielectric which can be selectively removed for connecting the conducting layer 106 to the conducting layer 108. The conducting layers 106 and 108 can be formed by depositing, lithographically patterning and etching using conventional techniques. Examples of the equipment which can be utilized for depositing the conducting layers 106 and 108 include an Applied Materials' PVD system configured for processing display substrates.

Dielectric layer 107 separates conducting layers 106 and 108. Dielectric layer 107 can also be a protective layer over the active region of bulk semiconductor layer 104 and a protective layer over other regions. Dielectric layer 107 is typically formed from dielectric materials, such as silicon dioxide, silicon nitride, silicon oxynitride, aluminum oxide, or a combination of these dielectric materials. Dielectric layer 107 can be formed in an HDP-CVD chamber manufactured by Applied Materials' AKT division or by use of another conventional technique. Dielectric layer 107 can be lithographically patterned and etched using conventional techniques. Feature 109 illustrates the passivating dielectric layer 107 disposed on the bulk semiconductor layer 104.

FIG. 1 is one example of a TFT structure. The device configuration shown in FIG. 1 is not intended to limit the scope of the disclosure provided herein, since there are many different ways to arrange the layout and layering order of a TFT device (e.g., top-gate TFT) such that the TFT comprises a gate, a gate dielectric, a semiconducting active layer, a source, a drain, and conductors connecting to the gate, the source, and the drain.

IGZO Depositing Apparatus

Figure 2:
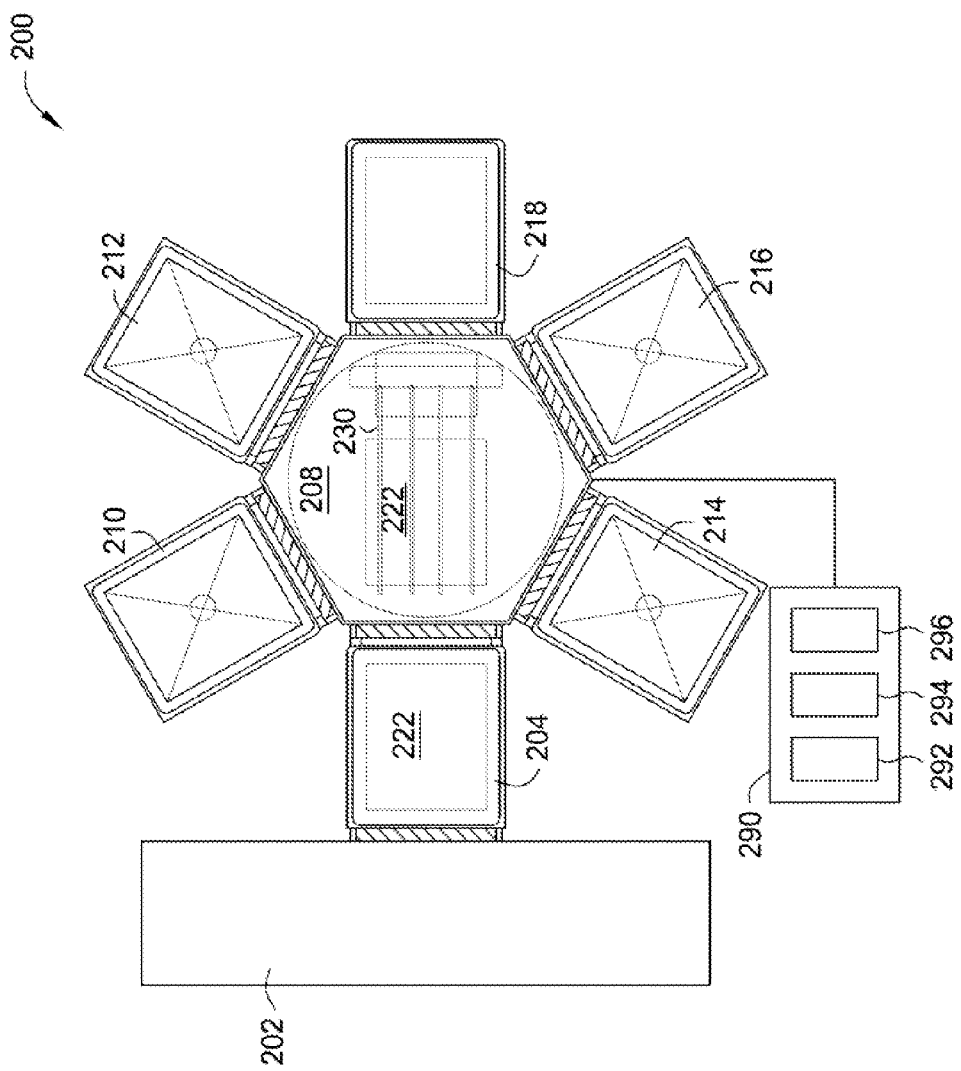
FIG. 2 is a schematic top view of a cluster tool, according to an embodiment of the disclosure.

FIG. 2 is a top plan view of a substrate processing system 200 suitable for forming, on a substrate 222, one or more of the layers of the TFT structure discussed above using the various deposition techniques described herein. The processing system 200 typically includes a transferring chamber 208 coupled to a factory interface 202 via a load lock chamber 204, or typically two vertically arranged, stacked load lock chambers 204, and a plurality of processing chambers 210, 212, 214, 216, 218 that are adapted to process the substrate 222.

The factory interface 202 generally includes one or more substrates stored therein or substrate storage cassettes. The substrate storage cassettes are typically removably disposed in a plurality of storage bays/compartments formed inside the factory interface 202. The factory interface 202 may also include an atmospheric robot, such as a dual blade atmospheric robot. The atmospheric robot is adapted to transfer one or more substrates between the one or more substrate storage cassettes and the load lock chamber(s) 204. Typically, the factory interface 202 is maintained at or slightly above atmospheric pressure, while the load lock chamber(s) 204 pressure is adjusted to facilitate a substrate moving between a vacuum environment of the transferring chamber 208 and a generally ambient environment of the factory interface 202.

The transferring chamber 208 is adapted to transfer substrates among a plurality of processing chambers 210, 212, 214, 216, 218 and the load lock chamber(s) 204 such that the transferring chamber 208 is surrounded by the plurality of processing chambers 210-218 and the load lock chamber(s) 204. The transferring chamber 208 is maintained at a vacuum condition to eliminate or minimize pressure differences between the transferring chamber 208 and any of the processing chambers 210-218 after each substrate transfer. For certain processing sequences, the vacuum condition of the transferring chamber 208 can eliminate or minimize changes to substrate surfaces (e.g., oxidation or moisture absorption) as substrates are transferred between any of the processing chambers 210-218. Furthermore, the vacuum condition maintained in the transferring chamber 208 can eliminate or minimize the communication of gases between any of the processing chambers 210-218 during the transfer of substrates through the transferring chamber 208.

In one embodiment, the processing system 200 is adapted to include various types of processing chambers. For example, the processing system 200 may include one or more CVD chambers, PVD chambers, atomic layer deposition (ALD), pretreating chambers, thermal processing chambers, layer treating chambers, substrate inspection chambers, or other useful processing chambers.

In the exemplary configuration of FIG. 2, the substrate 222 can be transferred between any of the processing chambers 210-218 and loadlock chamber(s) 204 within the processing system 200. In one embodiment, at least one of the processing chambers 210-218 is a CVD chamber, such as described below in conjunction with FIG. 3. A transferring robot 230, such as a dual arm vacuum robot available from Applied Materials, Inc., can be coupled to the transferring chamber 208 for moving the substrate 222 as described above. For example, a transferring robot 230 is coupled to the transferring chamber 208, and is configured to be rotatably movable within the transferring chamber 208.

In a typical example of a four-chamber processing or fabrication sequence performed within the processing system 200, a substrate can flow from the factory interface 202 to the load lock chamber(s) 204, through a sequence of four different processing chambers 210, 212, 214, and 216, again to the load lock chamber(s) 204 and finally back to the factory interface 202.

Preferably, the processing system 200 will include vacuum sealable valves, such as slit valves, gate valves, slot valves, etc., that are used to isolate the various processing chambers from each other. For example, the load lock chamber 204 may include internal and external vacuum sealable valves for maintaining a low pressure level after the substrate is loaded into and from the atmospheric environment of the factory interface 202. The valves may be coupled to internal or external actuators for opening and closing. In addition, the use of different types of pumps, such as a dry pump, a roughing pump, a turbo pump, and a cryogenic pump, among others, can be used to provide desirable vacuum pressure levels or staged vacuum levels as needed.

In general, a system controller 290 may be used to control one or more components found in the substrate processing system 200. The system controller 290 is generally designed to facilitate the control and automation of the processing system 200 and typically includes a central processing unit (CPU) 292, memory 294, and support circuits 296. The CPU 292 may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power source variables, gas flows, chamber pressure, chamber process time, I/O signals, etc.). The memory 294 is connected to the CPU 292, and may be one or more of a readily available type of a memory, such as random access memory (RAM), read only memory (ROM), floppy disk, hard disk, or any other form of digital storage, local or remote. Software instructions and data can be coded and stored within the memory 294 for instructing the CPU 292. The support circuits 296 are also connected to the CPU 292 for supporting the processor in a conventional manner. The support circuits 296 may include cache, power supplies, clock circuits, input/output circuitry, subsystems, and the like. A program (or computer instructions) readable by the system controller 290 determines which tasks are performable on a substrate. Preferably, the program is software readable by the system controller 290 that includes code to perform tasks relating to monitoring, execution and control of the movement, support, and/or positioning of a substrate along with the various process recipe tasks and various chamber process recipe steps being performed in the processing system 200. In one embodiment, the system controller 290 also contains a plurality of programmable logic controllers (PLC's) that are used to locally control one or more modules in the processing system 200, and a material handling system controller (e.g., PLC or standard computer) that deals with the higher level strategic movement, scheduling and running of the complete substrate processing system 200.

Figure 3:
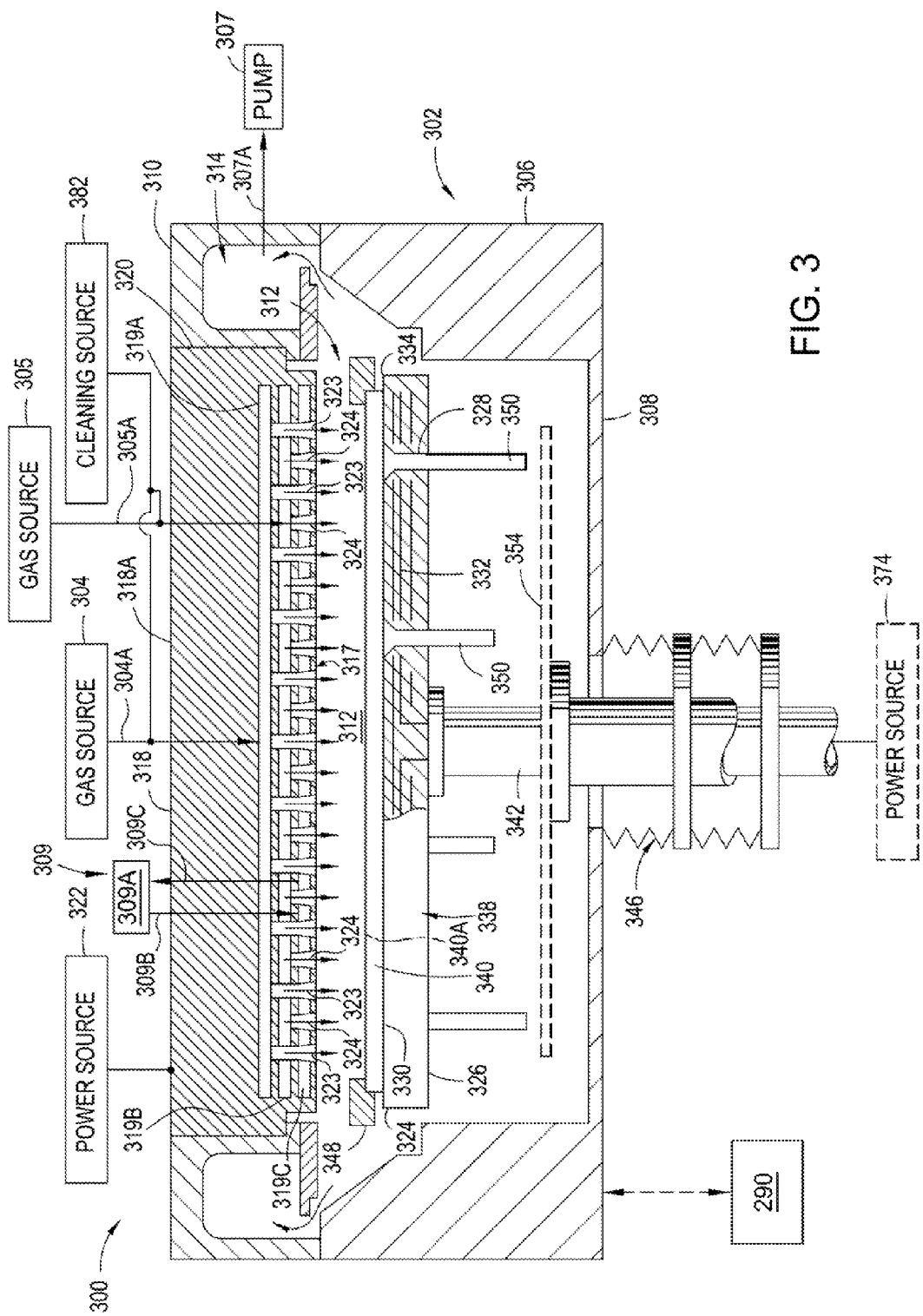
FIG. 3 is a cross-sectional illustration of a processing chamber, according to an embodiment of the disclosure.

FIG. 3 is a schematic cross-sectional view of one embodiment of a processing chamber 300, such as a plasma enhanced chemical vapor deposition chamber that is available from Applied Materials, Inc., Santa Clara, Calif. The processing chamber 300 generally includes a processing chamber body 302 coupled to a plurality of gas sources, such as gas source 304 and gas source 305. The processing chamber body 302 has walls 306 and a bottom 308 that partially define a processing volume 312. The processing volume 312 is typically accessed through a port (not shown) in the walls 306 that facilitate movement of a substrate 340 into and out of the processing chamber body 302. The walls 306 and bottom 308 are typically fabricated from aluminum or other materials compatible with processing. The walls 306 support a lid assembly 310 that contains a pumping plenum 314 that couples the processing volume 312 to an exhaust port 307A that is coupled to an external vacuum-type pump 307, which comprises a pumping system that includes various pumping components (not shown).

A temperature controlled substrate support 338 is centrally disposed within the processing chamber body 302. The substrate support 338 supports a glass substrate 340 during processing. In one embodiment, the substrate support 338 comprises an aluminum body 334 that encapsulates at least one embedded heater 332. The embedded heater 332, such as a resistive element, disposed in the substrate support 338, is coupled to a power source 374 and controllably heats the substrate support 338 and the glass substrate 340 positioned thereon to a predetermined temperature. Typically, in a CVD process, the embedded heater 332 maintains the glass substrate 340 at a uniform temperature between about 150 to at least about 460° C., depending on the deposition processing parameters for the material being deposited.

Generally, the substrate support 338 has a lower side 326 and an upper side 330. The upper side 330 supports the glass substrate 340. The lower side 326 has a stem 342 coupled thereto. The stem 342 couples the substrate support 338 to a lift system (not shown) that moves the substrate support 338 between an elevated processing position (as shown) and a lowered position that facilitates substrate transfer to and from the processing chamber body 302. The stem 342 additionally provides a conduit for electrical and thermocouple leads between the substrate support 338 and other components of the processing chamber 300.

The bellows lifting assembly 346 provides a vacuum seal between the processing volume 312 and the atmosphere outside the processing chamber body 302 while facilitating vertical lifting movements. Vertical lifting movements are required for moving the substrate 340 into the processing position (as shown) within the processing chamber 300.

The substrate support 338 is typically grounded, such that radio frequency (RF) energy supplied by a power source 322 to a showerhead 318 positioned between the lid assembly 310 and the substrate support 338 may excite gases present in the processing volume 312 between the substrate support 338 and the showerhead 318. The RF power from the power source 322 is generally selected commensurate with the size of the substrate to drive the chemical vapor deposition processes. One example of an RF power source 322 is a 5 kW 13.56 MHz power supply. Other alternatives for applying power and ground for exciting a plasma may be used to deposit a layer via a PECVD process.

The substrate support 338 additionally supports a substrate circumscribing shadow frame 348. Generally, the shadow frame 348 prevents deposition at the edge of the glass substrate 340 and substrate support 338. The substrate support 338 has a plurality of holes 328 disposed therethrough that accept a plurality of lift pins 350. The lift pins 350 are typically comprised of ceramic or anodized aluminum. The lift pins 350 may be actuated relative to the substrate support 338 by an optional lift plate 354 to project from the substrate support surface 330, thereby placing the substrate in a spaced-apart relation to the substrate support 338.

The lid assembly 310 typically can be removed or opened to service the processing chamber body 302. In one embodiment, the lid assembly 310 is fabricated from aluminum (Al). The lid assembly 310 includes the pumping plenum 314 formed therein coupled to the pump 307. The pumping plenum 314 is utilized to channel gases and processing by-products uniformly from the processing volume 312 and out of the processing chamber body 302.

The showerhead 318 is coupled to an interior side 320 of the lid assembly 310. The showerhead 318 is typically configured to substantially follow the profile of the glass substrate 340, for example, polygonal for large area flat panel substrates and circular for wafers. The showerhead 318 includes a perforated surface 317 through which process and other gases supplied from the gas source 304 are delivered to the processing volume 312. The perforated surface 317 of the showerhead 318 is configured to generally provide uniform distribution of gases passing through the showerhead 318 into the processing chamber body 302.

The showerhead 318 typically includes a plurality of gas plenums, such as precursor plenum 319A and precursor plenum 319B, that are each in communication with the perforated surface 317 by use of a plurality of gas distribution conduits (e.g., gas conduits 323 and 324), and a heat exchanging channel 319C. Generally, the number of plenums required for distributing a variety of gases depends on the chemical compatibility or reactivity of the gas flow components. In the case of IGZO PECVD processing, the metal-organic gases should not be in contact with oxygen until they are in proximity to the substrate, thus two (or more) plenums and separate gas source paths are needed.

The gas sources 304 and 305 are coupled to the showerhead 318 to provide one or more gases to the processing volume 312 during processing. The gas sources 304 and 305 may each include multiple gas sources coupled to supply lines 304A and 305A, respectively. Some of these gas sources may include a means of producing radicals from component gases, such a remote plasma source (RPS) which can dissociate some of the molecules in a molecular gas flow. For example, a flow of molecular $O_2$ can be dissociated into atomic oxygen. Each supply line 304A and 305A may comprise a plurality of lines that are coupled to and in fluid communication with the precursor plenum 319A and precursor plenum 319B, respectively. Depending on the process(es) being run in the processing chamber 300, some of the sources may be liquid sources rather than gases, in which case the gas delivery system may include a liquid injection system or other means (e.g., a bubbler) to vaporize the liquid. The vapor may then be mixed with a carrier gas such as hydrogen ($H_2$), nitrogen ($N_2$), helium (He), or argon (Ar) prior to delivery to the processing chamber 300. Furthermore, the supply lines 304A and 305A may include shut-off valves and mass flow controllers or other types of controllers to monitor and regulate or shut off the flow of gas in each line.

A process gas may flow from the gas source 304 through supply line 304A into the precursor plenum 319A and into gas conduits 323, which are in fluid communication with the processing volume 312. The process gas flows from gas source 305 through the supply line 305A into the precursor plenum 319B toward the processing volume 312. The precursor plenum 319A is not in fluid communication with the precursor plenum 319B so that a first process gas and a second process gas remain isolated until they are injected into the processing volume 312 located within the processing chamber body 302. The first process gas and/or second process gas may comprise one or more precursor gases or other process gases, including carrier gases and dopant gases, to carry out desired processes within the processing volume 312. For example, the first process gas and second process gas may contain one or more precursors for deposition of a material on substrates 340 positioned on the substrate support 338.

The heat exchanging channel 319C is coupled to a heat exchanging system 309 to control the temperature of the various surfaces of the showerhead 318. The heat exchanging system 309 comprises a heat exchanger 309A that is coupled to the one or more heat exchanging channels 319C formed in the showerhead 318 via an inlet conduit 309B and an outlet conduit 309C. The heat exchanging channel 319C, through which a heat exchanging fluid flows, is used to help regulate the temperature and temperature uniformity of the showerhead 318.

The heat exchanging channel 319C is disposed between the precursor plenum 319B and the perforated surface 317 of the showerhead 318. The heat exchanging channel 319C encircles the gas conduits 323 and 324. Thus, the heat exchanging fluid can flow around and control the temperature of the gas or vapor flowing through the gas conduits 323 and 324 while the vapor flows into the processing volume 312. The location of the heat exchanging channel 319C in proximity to the perforated surface 317 provides control of the temperature of various showerhead 318 features, such as the gas conduits 323 and 324 and the perforated surface 317.

Control of the temperature of the perforated surface 317 is desirable for a number of reasons. First, controlling the temperature of the perforated surface 317 may reduce or eliminate the formation of condensates on the showerhead 318. Control of the temperature of the various showerhead assembly features is also desirable to reduce gas phase particle formation and to prevent the production of undesirable precursor reactant products which may adversely affect the composition of the film deposited on the substrates 340. Second, maintaining a stable, uniform temperature on the perforated surface 317 helps to maintain a uniform temperature on the substrate 340, since the perforated surface 317 is the largest surface in proximity to the substrate 340 and the temperature of one may affect the temperature of the other through radiation and convective gas flows.

The showerhead temperature may be measured by one or more thermocouples (not shown) or other temperature sensors (not shown) disposed in proximity to showerhead face, heat exchanging channel 319C, and/or wall 306. Additionally or alternatively, one or more thermocouples or other temperature sensors may be disposed in proximity to the inlet conduit 309B and/or the outlet conduit 309C. The temperature data measured by the one or more thermocouples or other temperature sensors is sent to a controller which may adjust the heat exchanging fluid temperature and flow rate to maintain the showerhead temperature within a predetermined range. The showerhead temperature is generally maintained at about 50° C. to about 350° C., but may also be maintained at a temperature of greater than 350° C., if desired.

The flow rate of the heat exchanging fluid may be adjusted to help control the temperature of the showerhead 318. Additionally, the thickness of the walls surrounding the heat exchanging channel 319C may be designed to facilitate temperature regulation of the perforated surface 317. Suitable heat exchanging fluids include water, water-based ethylene glycol mixtures, a perfluoropolyether (e.g., GALDEN® fluid), oil-based thermal transfer fluids, or liquid metals such as gallium or gallium alloy. The heat exchanging fluid is circulated through the heat exchanger 309A to raise or lower the temperature of the heat exchanging fluid as required to maintain the temperature of the showerhead 318 within a desired temperature range. The heat exchanging fluid can be maintained at a temperature of 20° C. or greater, depending on process requirements. For example, the heat exchanging fluid can be maintained at a temperature within a range from about 20° C. to about 120° C., or within a range of about 100° C. to about 350° C. The showerhead 318 may be maintained at higher temperatures using readily available heat exchanging fluids.

The showerhead 318 is typically fabricated from stainless steel, aluminum (Al), anodized aluminum, nickel (Ni) or other RF conductive material. The showerhead 318 could be cast, brazed, forged, hot iso-statically pressed or sintered. The showerhead 318 is configured with a thickness that maintains sufficient flatness across the aperture 366 as not to adversely affect substrate processing. The thickness of the showerhead 318 is between about 0.8 inch and about 6.0 inches. The showerhead 318 could be circular for semiconductor wafer manufacturing or polygonal, such as rectangular, for flat panel display manufacturing.

The lid assembly 310 typically also includes a cleaning source 382 that may provide a cleaning agent, such as dissociated halogen gas (e.g., chlorine ($Cl_2$)), that is introduced into the processing chamber body 302 to remove deposition by-products and films from processing chamber hardware, including the showerhead 318. This removal of deposits is referred to as in-situ cleaning for maintaining a productive processing chamber 300.

Therefore, it is desirable to form a TFT device 100 having an IGZO layer formed therein. One or more processes which form such an IGZO layer are described below. The processes described below may use one or more of the hardware components described above.

IGZO Deposition and Processing Examples

A nucleation part (or first part) of a film's formation process can create a set of properties which define the remainder of the film layer. For example, if a first part of a film is amorphous, the subsequently deposited part of the layer is more likely to be amorphous (over a wider range of processing variables), while a crystalline first part of a film will more likely produce a subsequent crystalline film under the same processing circumstances. The depositing process of the first part of a film is affected by conditions of its environment, such as the surface (temperature and composition) and the processing chamber's depositing conditions. In particular, the applicants have discovered that by outgassing, pretreating, and treating a dielectric surface, it is possible to deposit an IGZO layer on a dielectric using a CVD process which exhibits a high carrier density for meeting IGZO TFT design requirements.

Figure 4:
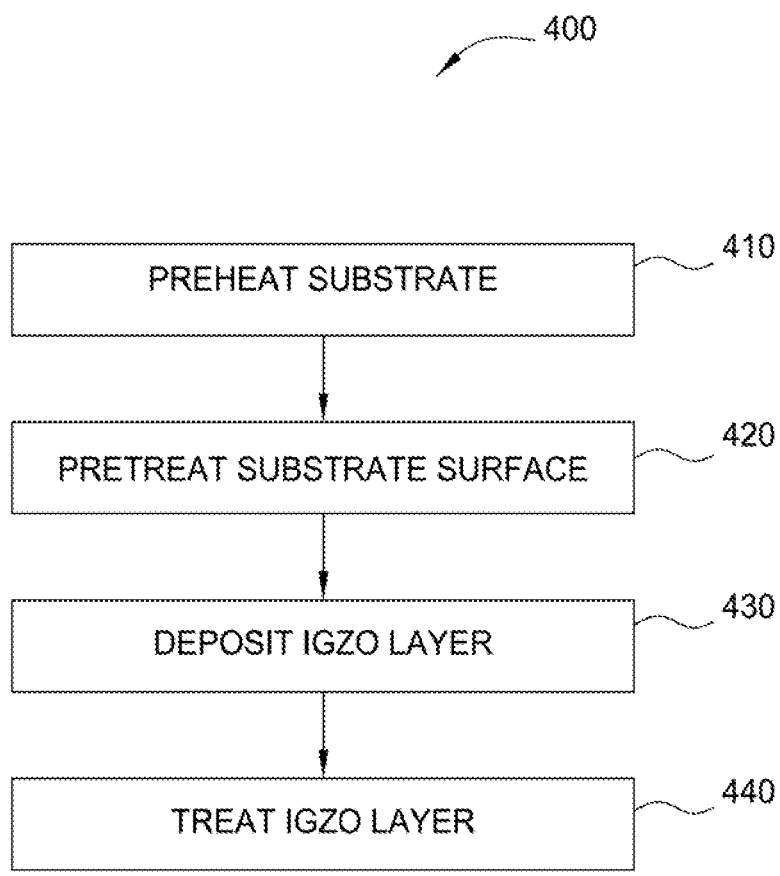
FIG. 4 is a process flow diagram for depositing a single IGZO layer in a processing chamber, according to an embodiment of the disclosure.

FIG. 4 is a process flow diagram for depositing an IGZO layer, which may be used to form TFT devices. Although the order of the steps can be changed, the preferred order, as shown, is a first step 410 of preheating, a second step 420 of pretreating, a third step 430 of depositing IGZO, and a fourth step 440 of treating the IGZO layer. In another example of process sequence 400, step 420 is performed before step 410. Process sequence 400 can be used to deposit an IGZO layer onto a substrate 101 with a patterned gate electrode layer 102 covered by a gate dielectric layer 103, as illustrated in FIG. 1, to form a part of the TFT device 100.

In one embodiment, a substrate is provided to a processing chamber such as processing chamber 300 (FIG. 3) for performing the entire process sequence 400 within a single chamber. By performing a number of steps in one processing chamber, other chambers on a processing system 200 (FIG. 2) can be allocated for other purposes, such as depositing underlayers or overlayers, or the processing system can be configured with a plurality of IGZO chambers for running a process sequence 400 in parallel for higher system throughput. Alternately, a processing system 200 can be configured with dedicated chambers for performing dedicated processing steps within a process sequence 400.

Preheating step 410 is the first of two steps for conditioning the substrate for receiving a IGZO layer. Performing preheating step 410 causes the substrate to be heated to the temperature required for depositing an IGZO layer. Second, the heating results in outgassing which removes gases and water vapor absorbed by the substrate during exposure to the atmosphere. This outgassing during a preheating step 410 reduces any subsequent outgassing, especially during the nucleation phase of an IGZO layer deposition process.

During the preheating step 410, the substrate can be heated to a temperature between 100° C. and 600° C. for a time typically between 30 seconds and 5 minutes. The time required for preheating depends on a number of factors which include time required for a particular substrate to reach a stable temperature, the amount of outgassing and time required to reduce outgassing, and the heating and outgassing characteristics of a subsequently performed pretreating step 420. In one example, the preheating step includes a 3 minute time period at a temperature of 375° C. at chamber pressure below atmospheric pressure.

Next, at step 420, a pretreating process is performed on the substrate surface to prepare the surface to receive the IGZO layer. Step 420 may include the use of a flow of radicals or the generation of a plasma over the substrate surface to clean the substrate surface. Step 420 may also continue (from step 410) the process of removing water vapor and surface organic contaminants from the substrate surface. The applicants believe that step 420 is an important process step in the forming of a high mobility IGZO layer in a TFT device, since step 420 can be used to passivate the substrate's dielectric surface, or form chemical bonds between the dielectric surface dangling bonds and the bombarding species (e.g., gas molecules, radicals, or ions), in order to prepare the surface for the IGZO layer.

In one embodiment, the step 420 is performed using a plasma containing an oxygen-containing gas. Oxygen ions and radicals can remove hydrogen, water vapor, and organic contaminants from the dielectric layer, and oxidize exposed pinholes in the gate dielectric layer. In one embodiment, at least one of the oxygen-containing gases oxygen ($O_2$), ozone ($O_3$), oxygen radicals ($O_1$) and nitrous oxide ($N_2O$) can be optionally mixed with any of the gases argon (Ar), helium (He), nitrogen ($N_2$), hydrogen ($H_2$), and ammonia ($NH_3$).

In one embodiment, a passivating pretreatment comprises exposing a dielectric surface to an inert gas containing plasma or hydrogen containing plasma to passivate dangling surface bonds.

In one example, step 420 includes a two step process. In a first oxidizing step, a 90 second, 2 kW plasma is formed with a gas flow of oxygen, ozone, nitrogen and/or argon. A second passivating step consists of a 30 second, 500 W plasma formed with a flow of $NH_3$ and He gases.

In step 430, an IGZO layer is deposited using a PECVD deposition technique. In this step, the preheated and pretreated substrate surface is exposed to a plasma, where separate gas flows are combined to produce a precursor gas mixture that includes indium, gallium, zinc and oxygen at the surface of the of the substrate. Although the IGZO processing chamber is configured to perform a PECVD process, an IGZO layer can be deposited without use of a plasma by selecting a zero RF power (e.g., a thermal CVD process).

In one embodiment, during the formation of the IGZO layer, process gases flow within two separate gas flow paths before they are delivered to the surface of the substrate. In one example, as shown above, the two separate gas flows may pass through two separate channels formed in a showerhead that is disposed over the surface of the substrate. In this case, the separate gas flows deliver the process gases to the processing chamber volume between the showerhead and the substrate. Flows of metal-organic precursors and oxygen are kept separate in order to prevent the deposition and particle formation within the gas flow paths inside the showerhead. Referring to FIG. 3, these two paths are illustrated as the separate gas flow paths 304-304A-319A-323-317-312 and 305-305A-319B-324-317-312, which pass from the gas sources through the perforated surface 317, and which only meet at the processing volume 312.

The first of the gas flows includes indium, gallium, and zinc metal-organic precursors: tri-methyl-indium (TMI), tri-methyl-gallium (TMG), and di-ethyl-zinc (DEZ), along with other "pushing" gases. Optionally, other metal precursors for the three metals indium, tri-ethyl-gallium (TEG) and di-methyl-zinc (DMZ) can be utilized in place of or in addition to those listed above. The purposes of pushing gases include bubbling the three separate liquid precursor sources, as well as providing a larger total flow (along the path between the bubblers and the showerhead) to keep the flow of precursors moving in the direction of the processing chamber volume. A typical flow of metal-organic precursors is between 5 and 150 standard cubic centimeters per minute (sccm), and a typical flow of pushing gases is at least a factor of 10 higher than that of the metal-organic precursors. The range of flows provided herein are for a 0.2 m² area substrate, and gas flows typically are proportional to substrate sizing. Pushing gases can include nitrogen ($N_2$), argon (Ar), and other gases which do not react with the metal-organic precursors. To minimize condensation of the metal-organic precursors, within the path 304-304A-319A-323-317-312 the path is heated. To keep flows moving out of the showerhead at all times, a purge flow (not shown, typically nitrogen) may be used when the process gases are not flowing. This causes a positive pressure which prevents back-streaming of gases from the chamber processing volume into the showerhead.

The second of the gas flows includes oxygen, ozone, and other gases which do not react with oxygen, such nitrogen ($N_2$) and argon (Ar). The second gas flow along the path 305-305A-319B-324-317-312 may include an apparatus (not shown) for forming radicals from one or more of the component gases. A purge flow, as described above for the first gas flow, can be utilized for preventing backstreaming into the showerhead.

Typically, a PECVD process that is used to deposit an IGZO layer will require a certain set of metal-organic precursor gas flows to form an IGZO layer that has a desired composition. The ratio of the metal-organic gas flows used to form the IGZO layer can be defined by a gas flow ratio X:Y:Z, which will result in an IGZO layer of $In_AGa_BZn_CO_D$, where the stoichiometric ratios of indium:gallium:zinc are A:B:C. The oxygen component D of the IGZO layer, typically unless otherwise noted, is roughly that of the separately naturally occurring oxides of indium, gallium, and zinc, which are $In_2O_3$, $Ga_2O_3$, and ZnO. Thus, for a layer $In_A$-$Ga_BZn_CO_D$, for example, D equals 1.5(A+B)+C for a fully oxidized film. In some embodiments the IGZO layer is not fully oxidized, such as in-situ depositing of a conductive contacting layer 105. In the case of PECVD deposition processes, changing of one metal-organic flow can produce a proportional change in the resulting IGZO film stoichiometric ratios. For example, if a certain set of flows X:Y:Z produces an IGZO layers with a 1:1:1 indium:gallium:zinc content, a doubling of the TMI flow, or flow ratio 2X:Y:Z results in (roughly) a 2:1:1 IGZO layer, with other process parameters left unchanged.

A single (mono-) layer of IGZO can thus be formed using one set of processing parameters (including metal-organic precursor gas flows) during a single depositing time period. The depositing time can be divided into smaller intervals, in which different processing parameters can be used for forming IGZO sub-layers with different material properties, such as different In:Ga:Zn stoichiometric ratios. For example, the depositing time can be divided into three separate time intervals to form the three IGZO sublayers 104A, 104B, and 104C. In this manner, the depositing time can be divided into N intervals, during which different IGZO sublayers are deposited, without lengthening the (deposition) processing time. In this manner, process development for IGZO CVD can proceed more quickly than comparable work using PVD. More importantly, a complex IGZO layer structure having many sublayers can be practically manufactured in a high-volume production setting, since the time for depositing a complicated structure is about that for depositing a mono-layer of IGZO.

The perforated surface 317 of the showerhead 318 is designed to minimize non-uniformity of the deposited IGZO film. First, the perforated surface 317 provides the substrate 340 with an even distribution of gas flows. In this design, an evenly mixed distribution of gas flows results from an even distribution of gas conduits 323 and 324, arranged in alternating checkerboard fashion such that each point on the substrate surface "sees" the same mix of metal-organic gas flows and oxygen-containing gas flows. Second, the perforated surface 317 is a capacitively coupled source for RF power for powering a plasma. The perforated surface 317 thus is an antenna for forming an evenly distributed plasma across the surface of the substrate 340. Third, the temperature of the perforated surface 317 is controlled so that it presents a uniformly radiating surface near the substrate 340 surface. Finally, the substrate support 338 temperature is controlled. Thus each point on the surface of the substrate 340 "sees" the same processing environment in order to achieve a uniform deposition of PECVD IGZO on the surface of the substrate in process step 430.

An RF power at a frequency of 13.56 MHz can be provided to the perforated surface 317 of the showerhead 318 in order to form a capacitively-coupled plasma during step 430. The power applied during processing is typically on the order of kilowatts for a display-sized substrate. This power will depend on a number of factors including substrate size. For a 0.2 square meter substrate the power can typically be in the range of 500 W to 5000 W. Zero RF power may also be selected for a thermally activated CVD IGZO process or a radical gas flow activated CVD IGZO depositing process.

In a PECVD process, the plasma ionizes and dissociates gases, thus increasing deposition rate of the IGZO layer. In some processes, it is desired to have a faster deposition rate by supplying an RF power. In some processes it may be desirable to select a zero RF power that may produce desirable properties in a deposited IGZO layer.

A substrate is thermally coupled to the temperature-controlled substrate support through conduction, radiation and short convective flows within the gap formed between the substrate 340 and the substrate support 338. The substrate temperature also depends on plasma conditions and heat radiated by the showerhead.

One example of process step 430, an IGZO CVD process recipe includes providing a substrate on a substrate support that is maintained at a temperature of 375° C., a showerhead temperature of 125° C., a chamber pressure of 250 mTorr, a TMI flow of 60 sccm, a TMG flow of 60 sccm, a DEZ flow of 30 sccm, an $N_2$ push flow of 3000 sccm, an Ar push flow of 1000 sccm total, an $O_2$ flow of 800 sccm, and a plasma power of 2.0 kW.

After the IGZO film is deposited, in one embodiment it may be treated, or conditioned, as shown in process step 440 in FIG. 4. Treating the IGZO layer may include methods such as annealing, exposing to radicals or exposing the IGZO layer to a plasma. Some of the methods are similar to the step 420 already described above. In particular, passivation of the IGZO surface can be performed during an IGZO treating process performed within step 440, in order to reduce uptake of water vapor during subsequent exposures to atmospheric humidity or wet processing. Water absorption by the film can be minimized by exposing the IGZO layer top surface to a passivation treatment which connects surface dangling bonds to terminating atoms or molecular components, which also may control the band bending characteristics of the top semiconductor-dielectric interface.

Figure 5:
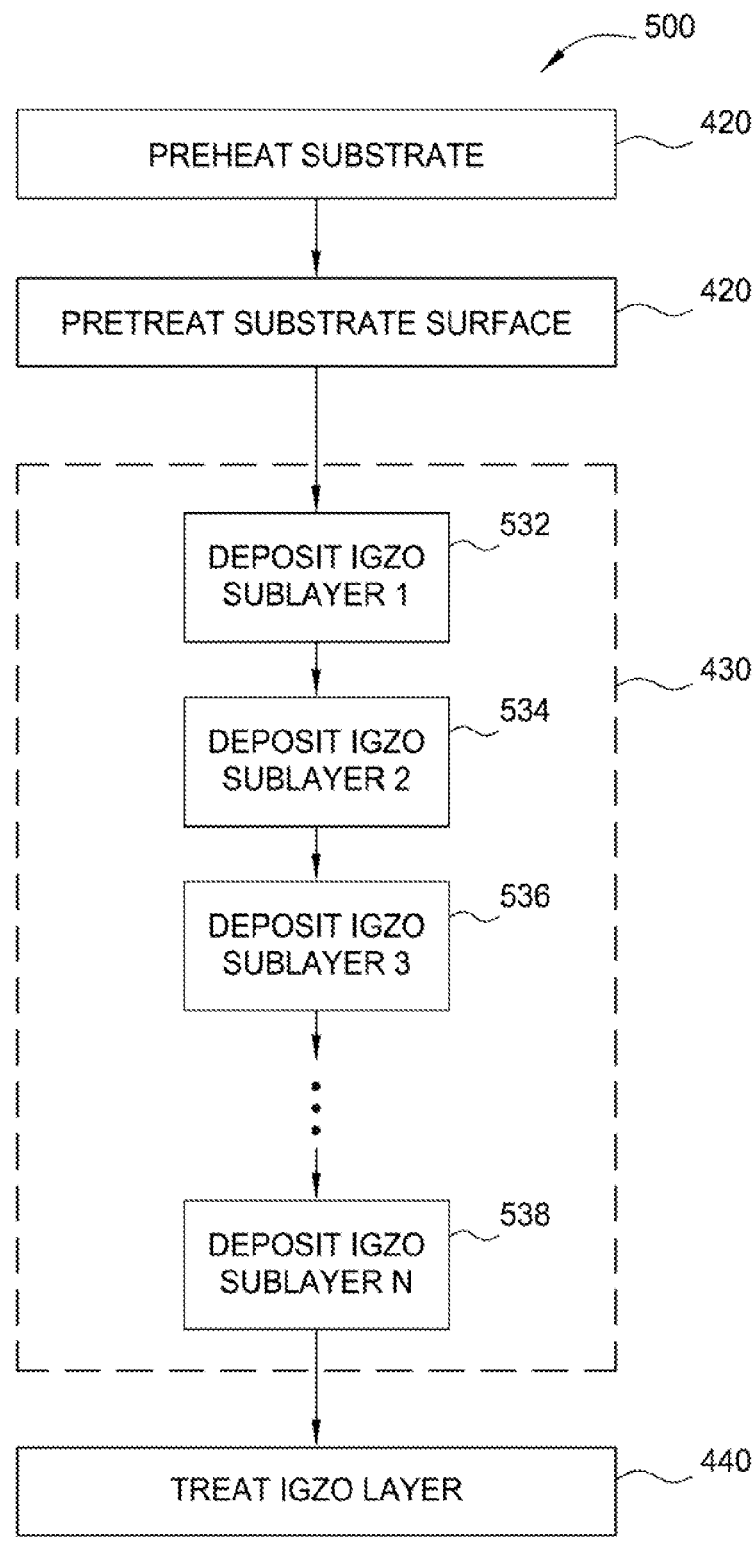
FIG. 5 is a process flow diagram for depositing a multi-layer IGZO structure within a processing chamber, according to an embodiment of the disclosure.

FIG. 5 illustrates an IGZO deposition process sequence 500 that is used to deposit an IGZO layer that has N sublayers. In some embodiments of the process sequence 500, the surface treating steps (410, 420, and 440) are similar to those described above in process sequence 400. Therefore, in one example, the difference between process sequences 400 and 500 is the division of step 430 into separate substeps, as illustrated as substeps 532-538 in FIG. 5.

Each of the IGZO sublayers deposited using process substeps 532-538 can have different material characteristics, such as different $In_A$:$Ga_B$:$Z_C$ stoichiometric ratios A:B:C, as described above, by changing metal-organic gas flow ratios during the deposition process. Some of the processes used to deposit one or more of the IGZO sublayers could be performed at a low or zero RF power level. In one example, the top and/or bottom IGZO sublayers are formed using a process with a zero RF deposition power. Thus an N-sublayer structure can be produced, within a single processing chamber, in roughly the same time that is required for a single (mono-) layer. Depositing an equivalent N-sublayer structure using a PVD process sequence would require N separate PVD chambers, each equipped with a separate target with a given $In_A$:$Ga_B$:$Z_C$ composition to match that of the sublayer that is to be deposited.

The separate IGZO sublayers within the IGZO layer can have individual material properties which result from an individual processing substep. For instance, in some embodiments, an IGZO layer could be constructed as shown in FIG. 1 with three sublayers, wherein a first sublayer has material properties which produce a desirable gate dielectric interface, a middle or bulk layer has material properties which provide for a high carrier density, and a third or top layer has a higher conductance than the other two layers for achieving minimum contact resistances at the source and drain connections.

The process parameters for the IGZO depositing substeps 532-538 can be selected for forming a wide variety of N-sublayer IGZO structures. One example of a N-sublayer IGZO structure comprises a band engineered quantum well structure with thin layers of alternating stoichiometric ($In_A$: $Ga_B$:$Z_C$) ratios. Another embodiment is the in-situ depositing of a conductive contacting layer 105. After the depositing of an IGZO N-sublayer structure, it is possible to deposit either a highly doped IGZO contacting layer 105 or even a non-oxygen containing metallic layer that is formed from the available precursor gases, e.g., zinc.

In summary, the process sequence 500 allows for development of any number of complex structures of IGZO layers, which may find application in a TFT device. These complex IGZO layers can be useful for high volume manufacturing, since PECVD processes allow for these IGZO structures to be manufactured as easily as a single IGZO (mono-) layer.

Figure 6:
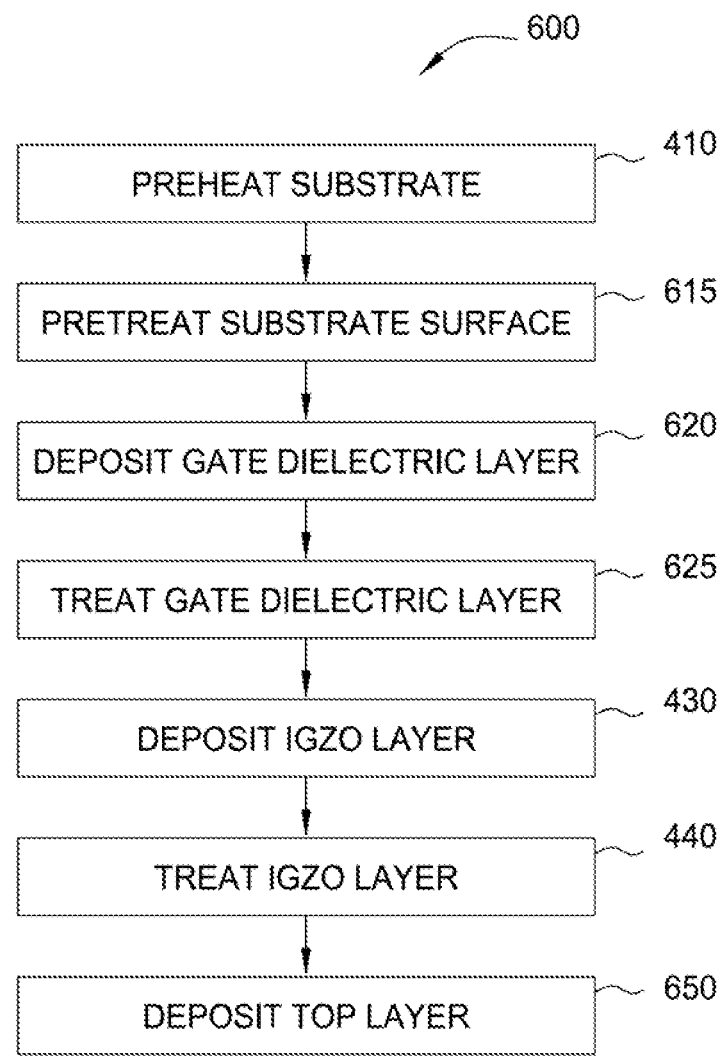
FIG. 6 is a process flow diagram for depositing an integrated film stack, according to an embodiment of the disclosure.

FIG. 6 illustrates an in-situ integrated process sequence 600 that can be used to form an in-situ multilayer stack within a TFT device, which may include a gate dielectric layer, IGZO layer and top layer. Process sequence 600 comprises a preheat substrate step 610, a pretreat substrate step 615, a deposit gate dielectric layer step 620, a treat gate dielectric step 625, a deposit IGZO layer step 430, a treat IGZO layer step 440, and a deposit top layer step 650. The order described herein is a preferred configuration, but the sequence of steps can be rearranged as needed. In one embodiment, the pretreat substrate step 615 is performed before the preheat substrate step 610. This integrated process sequence 600 enables manufacturing of IGZO TFTs with a higher productivity.

Typically, similar conventional process sequences have required three separate processing systems to perform the tasks described herein, where each of the depositing steps requires a separate depositing system. Each of these separate systems will require separate handling components, load-lock pumping components, preheating components, and other supporting chambers components. The transfer of substrates between processing systems requires labor, while each ex-situ handling event also exposes the substrates to oxidation, atmospheric moisture, contamination and risk of substrate breakage. By reducing the amount of handling and peripheral (non-process) actions, it is possible to increase throughput in a high volume production setting, while reducing labor and system footprint requirements. Therefore the process sequence 600, as compared to a multiple tool manufacturing process sequence, can reduce manufacturing expenses and improve product yield.

In one embodiment, the preheating step 610 is similar to the preheating step 410, which is described above. To summarize, the substrate is heated to a processing temperature and is outgassed. In one embodiment, the pretreat substrate step 615 is similar to the pretreating step 420, which is also previously described.

Deposit gate dielectric layer step 620, as shown in FIG. 6, is a process step for depositing a gate dielectric on a substrate surface that may have the patterned gate electrodes disposed thereon. This dielectric layer may function not only as a gate dielectric, but also as an etch stop layer and a diffusion barrier. In one embodiment, this gate dielectric can be a single layer or a layer stack made of silicon dioxide ($SiO_2$), silicon nitride (SiN), silicon oxynitride ($SiO_xN_y$), and aluminum oxide ($Al_2O_3$).

In one embodiment, the processing chamber, for depositing the gate dielectric layer in step 620, is a high density plasma depositing chamber. One example of such a chamber may be provided by Applied Materials for depositing dielectric layers onto large rectangular substrates. This particular dielectric deposition chamber utilizes an inductively-coupled source for forming a high density plasma (HDP), in addition to a RF-powered showerhead (as described for the IGZO CVD chamber), and a RF-powered substrate. This system allows for a high deposition rate of a dielectric material onto a large area substrate. Another notable difference of the dielectric depositing chamber is a simplified showerhead or gas distribution plate assembly, which is designed to only have one gas supply plenum (while the IGZO process chemistry requires two separated plenums 319A and 319B.) Many other aspects of the dielectric chamber are similar in illustration. This HDP-CVD type chamber is typically utilized for depositing dielectric layers such as those described in the disclosure.

A treat gate dielectric step 625 is similar to the pretreating step 420 already described. However, the treated gate dielectric in process sequence 600 has not been exposed to air or water vapor, so the processing time for the treat gate dielectric step 625 may shorter than that for the previously described pretreating step 420. After treating the gate dielectric layer, an IGZO layer is formed on the substrate and then it is treated. The deposit IGZO layer step 430 and the treat IGZO layer step 440 within process sequence 600 are similar to those already described above.

After treating the IGZO layer, a top layer can be formed. Step 650 is a process step that is used to form top layer(s) over the treated IGZO layer. There are many practical material possibilities for a top layer or top layer stack. In one embodiment, the top layer is a dielectric layer or stack of dielectric sublayers similar to that designated for the processing step 620. The resulting layer or stack of dielectric layers can serve as an etch stop layer, a passivation layer, a dielectric insulating layer, or a diffusion barrier layer. Dielectric materials for a dielectric stack include silicon dioxide or glass ($SiO_2$), silicon nitride (SiN), silicon oxynitride ($SiO_xN_y$), and aluminum oxide ($Al_2O_3$). In another embodiment, the top layer is a highly conducting IGZO layer (as a continued depositing of the active layer) or even a metallic alloy of indium, gallium and zinc. In one example, during step 650 a top layer comprising aluminum oxide ($Al_2O_3$) (e.g., dielectric layer 107 in FIG. 1) is formed over the IGZO layer to protect IGZO layer from subsequent processing environments and/or atmospheric contamination, or even act as an interlayer dielectric. The top layer comprising aluminum oxide may be formed by use of a PECVD, CVD or ALD process using a tri-methyl-aluminum (TMAl) containing precursor gas and an oxygen containing gas, such as $O_3$, $O_2$, $N_2O$, to form an $Al_2O_3$ layer.

In yet another embodiment, the top layer is a multilayer stack that includes a highly conductive IGZO contacting sublayer, a metal layer, and/or a dielectric passivation layer. In summary, embodiments of process step 650 include processes for depositing semiconducting contacting layers, conducting layers, and for dielectric layers and dielectric stacks. The layers deposited by performing the process sequence 600 can be lithographically patterned and etched using conventional techniques.

A CVD processing chamber used in a high volume manufacturing setting will accumulate deposits which are byproducts of the chemical vapor deposition process. Generally, a CVD processing chamber is designed to maximize deposition on the substrate and minimize deposition elsewhere within the processing chamber. Nevertheless there is a need for an in-situ cleaning capability. A processing chamber 300 (FIG. 3) can be cleaned with an in-situ chamber clean, which can be selected for removing deposits, and can be additionally selected for not removing processing chamber materials. The in-situ clean typically requires an excitation source such as a flow of reactive radical species or exposure to a plasma. Chamber cleaning gas flows react with the deposits to form volatile products which are pumped away.

Minimizing the removal of chamber materials can be facilitated by detecting an endpoint to the cleaning process. In a typical endpoint-controlled process (e.g., etching of a layer material from a substrate), a system controller 290 can terminate a process step when a specific shift is detected in a chamber parameter. Generally the choice of chamber parameter is known to correlate to the completion of a step, such as complete removal of a material during the cleaning process. Detecting an endpoint can be accomplished by methods such as detecting a shift in plasma impedance, detecting a shift in a position of a pressure-controlling valve, or detecting a shift in a light spectrum produced by a plasma. In the latter method, an optical fiber can couple a chamber port window to a spectrometer. Spectral peaks associated with the reacted deposits in the plasma can be utilized as a parameter for determining endpoint. Endpoint determining is facilitated by a system controller 290 typically utilizing selectable, tunable algorithms such as those conventionally utilized with plasma etching chambers manufactured by Applied Materials, Inc. Typically the tracked parameter (e.g., a spectral peak) follows an S-shaped curve, and the endpoint detection comprises detecting the bottom of the S-shaped curve.

A processing chamber 300 used in high volume production can be cleaned with regularly scheduled in-situ chamber cleans so the deposits do not become thick enough to affect production (e.g., deposits peeling and falling onto substrate 340). One embodiment of a chamber clean is a flow of radicals, including chlorine, for volatizing particles or deposits within the showerhead 318 even before flowing into the plasma containing processing volume 312. Deposits inside the showerhead 318 are generally minimized by maintaining a continual flow of an inert purge gas (e.g., argon or nitrogen) even when the processing chamber 300 is idle or inactive in the time period between processing of substrates. Such a continual flow facilitates the condition of fluid noncommunication between plenums 319A and 319B, since it would otherwise be possible for gases to flow from one plenum to another via the processing volume 312.

Another embodiment of a chamber clean involves using a plasma for bombarding surfaces with a mixture of ions from halogens (e.g., chlorine) and other gases, such as argon (Ar), nitrogen ($N_2$), and oxygen ($O_2$), ozone ($O_3$), nitrous oxide ($N_2O$), ammonia ($NH_3$), and $NF_3$.

One example of a chamber cleaning process comprises: placing a glass substrate into the processing position of a processing chamber 300; flowing a mixture of 250 sccm chlorine ($Cl_2$) dissociated by a remote plasma source (RPS), 100 sccm argon (Ar), and 200 sccm nitrogen ($N_2$) into the (metal-organic flow) plenum 319A; flowing 250 sccm chlorine ($Cl_2$) dissociated by RPS, 200 sccm nitrogen ($N_2$), and 50 sccm ozone ($O_3$) into the (oxygen-flow) plenum 319B; maintaining a pressure of 100 mTorr; applying 2000 W RF power to the showerhead; and running a 20 minute (maximum) recipe to an endpoint which tracks a zinc optical spectral peak.

Although several preferred embodiments which incorporate the teachings of the present disclosure have been shown and described in detail, those skilled in the art can readily devise many other varied embodiments that still incorporate these teachings.

What is claimed is:

1. A method of forming a thin film transistor device, sequentially comprising:
   exposing a substrate having a dielectric surface to a pretreating process, wherein the pretreating process comprises:
      heating the substrate having the dielectric surface for between about 30 seconds and about 5 minutes to a first temperature between about 100° C. and about 600° C. to outgas gases and water vapor; and
      exposing the dielectric surface to a plasma to remove surface contaminants;

delivering, through a first port in a gas distribution apparatus of a processing chamber, a first gas mixture of metal-organic precursor gases that comprises indium, gallium, zinc, and a first carrier gas to the dielectric surface that is disposed in a processing region of the processing chamber;

delivering, through a second port in the gas distribution apparatus, a second gas mixture that comprises at least an oxidizing gas and a second carrier gas to the dielectric surface disposed in the processing region of the processing chamber; and delivering radio frequency (RF) energy to the processing region of the processing chamber, to form a plasma disposed between the gas distribution apparatus and the dielectric surface, wherein the plasma comprises the first metal-organic precursor gas mixture and the second oxygen-comprising precursor gas mixture, to form an IGZO layer on the dielectric surface.

2. The method of claim 1, wherein the first gas mixture comprises one or more precursor gases selected from the group consisting of tri-methyl-indium (TMI), tri-methyl-gallium (TMG), tri-ethyl-gallium (TEG), di-methyl-zinc (DMZ) and di-ethyl-zinc (DEZ).

3. The method of claim 1, wherein the first carrier gas comprises nitrogen ($N_2$) and argon (Ar).

4. The method of claim 1, wherein the at least one oxidizing gas is selected from the group consisting of oxygen radicals ($O_1$), oxygen ($O_2$), ozone ($O_3$) and nitrous oxide ($N_2O$).

5. The method of claim 1, wherein the second carrier gas comprises nitrogen ($N_2$) and argon (Ar).

6. The method of claim 1, wherein the IGZO layer comprises three or more sublayers that include:
a gate interfacing sublayer disposed over the dielectric surface;
one or more middle sublayers that have a carrier mobility greater than that of the gate interfacing sublayer; and
a contacting sublayer that has a conductivity greater than the conductivity of the middle sublayers.

7. The method of claim 6, further comprising a metallic contacting sublayer which comprises a material selected from the group consisting of indium, gallium and zinc.

8. The method of claim 1, further comprising exposing a surface of the formed IGZO layer to radicals, wherein the radicals are formed from gases selected from the group consisting of oxygen ($O_2$), ozone ($O_3$), nitrous oxide ($N_2O$), nitrogen ($N_2$), ammonia ($NH_3$), $NF_3$, water vapor ($H_2O$), and hydrogen ($H_2$).

9. The method of claim 1, further comprising exposing a surface of the formed IGZO layer to a post-treating process.

10. The method of claim 9, further comprising exposing the surface of the formed IGZO layer to radicals.

11. The method of claim 10, wherein the radicals are formed from a gas selected from the group oxygen ($O_2$), ozone ($O_3$), nitrous oxide ($N_2O$), nitrogen ($N_2$), ammonia ($NH_3$), hydrogen ($H_2$), $NF_3$, $CF_4$, ethane ($C_2H_6$), and methane ($CH_4$).

12. The method of claim 1, further comprising delivering a first chamber cleaning gas mixture to the processing region of the processing chamber.

13. The method of claim 12, further comprising detecting an endpoint to terminate the chamber cleaning process.

14. The method of claim 1, further comprising:
forming a top layer over the formed IGZO layer, wherein the top layer comprises aluminum oxide.

15. A method of forming a thin film transistor device, sequentially comprising:
exposing a substrate having a dielectric surface to a pretreating process, wherein the pretreating process comprises:
heating the substrate having the dielectric surface for between about 30 seconds and about 5 minutes to a first temperature between about 100° C. and about 600° C. to outgas gases and water vapor; and
exposing the dielectric surface to a plasma to remove surface contaminants;
delivering, through a first port in a gas distribution apparatus of a processing chamber, a first gas mixture of metal-organic precursor gases that comprises indium, gallium, zinc, and a first carrier gas to the dielectric surface that is disposed in a processing region of the processing chamber; and
delivering, through a second port in the gas distribution apparatus, a second gas mixture that comprises at least an oxidizing gas and a second carrier gas to the dielectric surface disposed in the processing region of the processing chamber, wherein the first gas mixture and the second gas mixture are used to form an IGZO layer on the dielectric surface.

16. The method of claim 15, further comprising:
forming a top layer over the formed IGZO layer, wherein the top layer comprises aluminum oxide.

17. The method of claim 15, wherein the IGZO layer comprises of N sublayers, where N is an integer greater than 1, and where the material properties of each sublayer are different than the material properties of adjacent sublayers.

18. The method of claim 17, wherein the formed IGZO layer comprises a layer that has a gradient in at least one material property that includes indium:gallium:zinc composition ratios.

19. The method of claim 17, wherein the formed IGZO layer comprises three or more sublayers that include:
a gate interfacing sublayer disposed over the dielectric surface;
one or more middle sublayers that have a carrier mobility greater than that of the gate interfacing sublayer; and
a contacting sublayer that has a conductivity greater than the conductivity of the middle sublayers.

* * * * *